United States Patent

Bogdan

[11] Patent Number: 6,148,052
[45] Date of Patent: Nov. 14, 2000

[54] DIGITAL PHASE DETECTOR WITH RING OSCILLATOR CAPTURE AND INVERTER DELAY CALIBRATION

[75] Inventor: Wladyslaw Bogdan, Ottawa, Canada

[73] Assignee: Nortel Networks Corporation, Montreal, Canada

[21] Appl. No.: 08/988,391

[22] Filed: Dec. 10, 1997

[51] Int. Cl.[7] .................................................. H03D 3/24
[52] U.S. Cl. ........................... 375/375; 375/376; 331/25; 331/57; 327/159
[58] Field of Search ................................... 375/375, 376; 331/57.1 A, 25; 327/159, 156, 161

[56] References Cited

U.S. PATENT DOCUMENTS

| | | | |
|---|---|---|---|
| 5,341,405 | 8/1994 | Mallard, Jr. ............................... | 375/120 |
| 5,511,100 | 4/1996 | Lundberg et al. ........................ | 375/376 |
| 5,528,198 | 6/1996 | Baba et al. ................................ | 331/1 A |
| 5,799,049 | 12/1999 | McFarland et al. ...................... | 375/362 |
| 5,811,998 | 8/1999 | Lundberg et al. ........................ | 327/156 |
| 5,910,740 | 8/1999 | Underwood ............................... | 327/149 |
| 5,939,947 | 6/1996 | Nakao et al. .............................. | 331/11 |
| 6,002,731 | 12/1999 | Aoki et al. ................................ | 375/371 |

*Primary Examiner*—Stephen Chin
*Assistant Examiner*—Dac V. Ha

[57] ABSTRACT

A DPD (digital phase error) circuit for measuring the phase skew between a first and a second clock signal for use in a variety of control systems and more particularly for use in DPLL (digital phase-locked loop) synchronizers. The DPD includes an ROG (ring oscillator generator) which has a string of inverter gates forming an RO (ring oscillator) and a ring counter. The ring counter operates to monitor the time elapsed from the occurrence of a reset clock signal edge by recording the number of oscillation periods of the RO. The RO and ring counter are coupled to an ROC (ring oscillator capture) unit which operates to capture the state of the RO and ring counter for every occurrence of a respective first clock signal edge and second clock signal edge so as to accurately evaluate the time elapsed since the occurrence of the preceding reset clock signal edge. These measurements are routed to a CU (control unit) where they are processed to determine the actual phase error between the first and second clock signals. For each capture effected in the ROC, a highly accurate calibration signal generated to have a fixed phase deviation from the reset clock signal is received for capturing state of the RO and ring counter to determine the average inverter propagation delay of the inverter gates forming the RO and accordingly calibrate each phase error in accordance with the proper average inverter propagation delay.

19 Claims, 7 Drawing Sheets

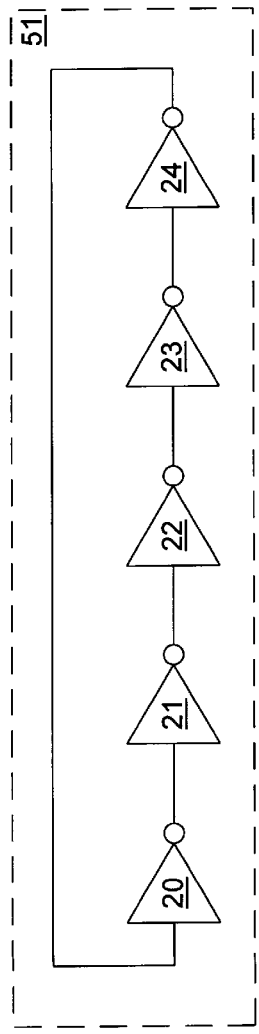
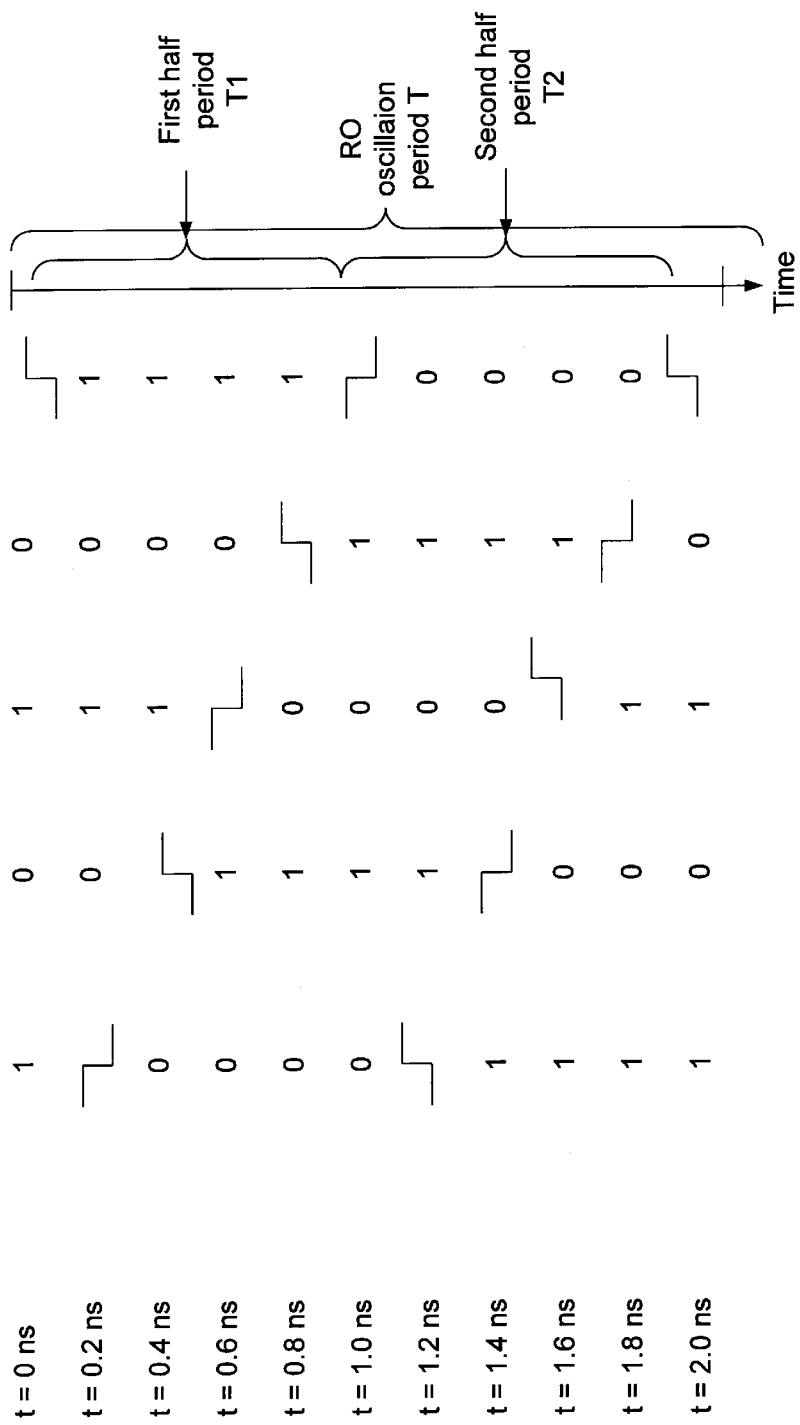
FIG. 3

DIGITAL PHASE DETECTOR WITH RING OSCILLATOR CAPTURE AND INVERTER DELAY CALIBRATION

FIELD OF THE INVENTION

This invention relates generally to digital phase detectors and more particularly to a digital phase detector with a ring oscillator capture and inverter delay calibration.

BACKGROUND ART

In telecommunication systems, the receiver is assumed to be able to generate a set of local clock signals whose characteristics are identical to the characteristics of the signalling alphabet in use at the transmitter. The alignment of the locally generated clock signals with the clock information extracted from the received signal referred to as the reference clock is achieved with the use of a synchronization reference selected in relation with the modulation protocol employed and extracted from the incoming signal.

For low frequency applications such as frame and symbol synchronization, this alignment is usually accomplished with a DPLL (digital phase locked loop). The main components of the DPLL synchronizer include a DPD (digital phase detector) for measuring the phase error between the reference clock and a locally generated clock and a DCO (digitally controlled oscillator) for generating that local clock.

The timing constraints imposed over the years by state-of-the art technology applications caused the DPDs to rapidly evolve to provide enhanced phase error measurement accuracy and resolution for improving the performance of DPLL-based designs. However, the DPDs used in present day synchronizers are designed with digital counters based on flip-flop gate arrangements which are known to exhibit large propagation delays. As such, they do not present a satisfactory phase error resolution.

In order to meet the strict requirements of today's synchronization applications, the DPDs necessitate additional circuitry to eliminate counter-wraps and phase buildups for improving the performance of the synchronizers. However, this complicates the design and heavily affects synchronization costs.

Accordingly, there is a need for a DPD circuit for providing phase error measurements with high resolution and improved accuracy which is simple to implement and cost-efficient.

SUMMARY OF THE INVENTION

It is an object of the present invention to obviate or mitigate one or more of the above-identified disadvantages.

According to a first broad aspect, the invention provides a DPD (digital phase detector) for providing an indication of a phase skew relationship between a first and a second signal, the DPD comprising an oscillating circuit and a capture circuit for capturing the state of the oscillating circuit at the occurrence of an edge of the first and second signals for determining the phase skew relationship.

According to a second broad aspect, the invention provides a method of determining a phase skew relationship between a first and a second signal, the method comprising the steps of capturing the state of an oscillating circuit at the occurrence of an edge of the first signal, capturing the state of the oscillating circuit at the occurrence of an edge of the second signal and processing the captures for determining the phase skew relationship between the first and second signals.

In particular, the invention provides an inexpensive but reliable DPD circuit for measuring the phase error skew between a reference clock signal and a locally generated clock signal for use in a variety of control systems and more particularly for use in DPLL (digital phase-locked loop) synchronizers.

In a preferred embodiment of the invention, the DPD is incorporated in a microsynchronizer which also has a CU (control unit), a DCDCI (digitally controlled duty cycle integration) circuit, a VCXO (voltage controlled crystal oscillator), a stand-alone PLL and a frequency dividing unit to operate in a DPLL mode for locally generating in a host receiver a clock signal synchronized with the signalling employed at the transmitter and more particularly synchronized with a reference clock signal.

More specifically, the DPD has enclosed in a ROG (ring oscillator generator), a string of inverter gates forming a RO (ring oscillator) and a ring counter. The ring counter operates to monitor the time elapsed from the occurrence of a reset clock signal edge by recording the number of oscillation periods of the RO. The RO and ring counter are coupled to a ROC (ring oscillator capture) unit which is also coupled to receive the reference clock signal and the locally generated clock signal. For every respective reference clock edge and local clock edge, the ROC operates to capture the state of the RO and ring counter so as to accurately evaluate the time elapsed since the occurrence of the preceding reset clock signal edge and produces a corresponding reference clock phase skew signal and local clock phase skew signal. These signals are routed to the CU where they are processed to determine the actual phase error between the reference clock signal and the locally generated clock signal. For each phase skew measurement effected in the DPD, a highly accurate calibration signal generated to have a fixed phase deviation from the local clock signal is received for capturing state of the RO and ring counter to determine the average inverter propagation delay of the inverter gates forming the RO and accordingly calibrate each phase error in accordance with the proper average inverter propagation delay.

Preferably, the microsynchronizer also has a second DPD for detecting phase deviations of the locally generated clock signal which are caused by temperature fluctuations of the circuit components used in the host receiver. This second DPD has a ROC unit coupled to receive the output signal of a TCXO (temperature controlled crystal oscillator) and the locally generated clock signal for capturing the state of the ROG described above with reference to the first DPD and produce a TCXO phase skew signal and a local phase skew signal which are supplied to the CU. The CU processes these signals to determine the phase error between the TCXO clock signal and the locally generated clock signal and operates the necessary adjustments to compensate for temperature fluctuations of the host receiver.

BRIEF DESCRIPTION OF THE DRAWINGS

Preferred embodiments of the invention will now be described with reference to the attached drawings in which:

FIG. 3 is a block diagram of an exemplary RO (ring oscillator) and associated timing plots for explaining the operation of the ROG illustrated in FIG. 2;

DETAILED DESCRIPTION OF THE PREFERRED EMBODIMENTS

Figure 1:
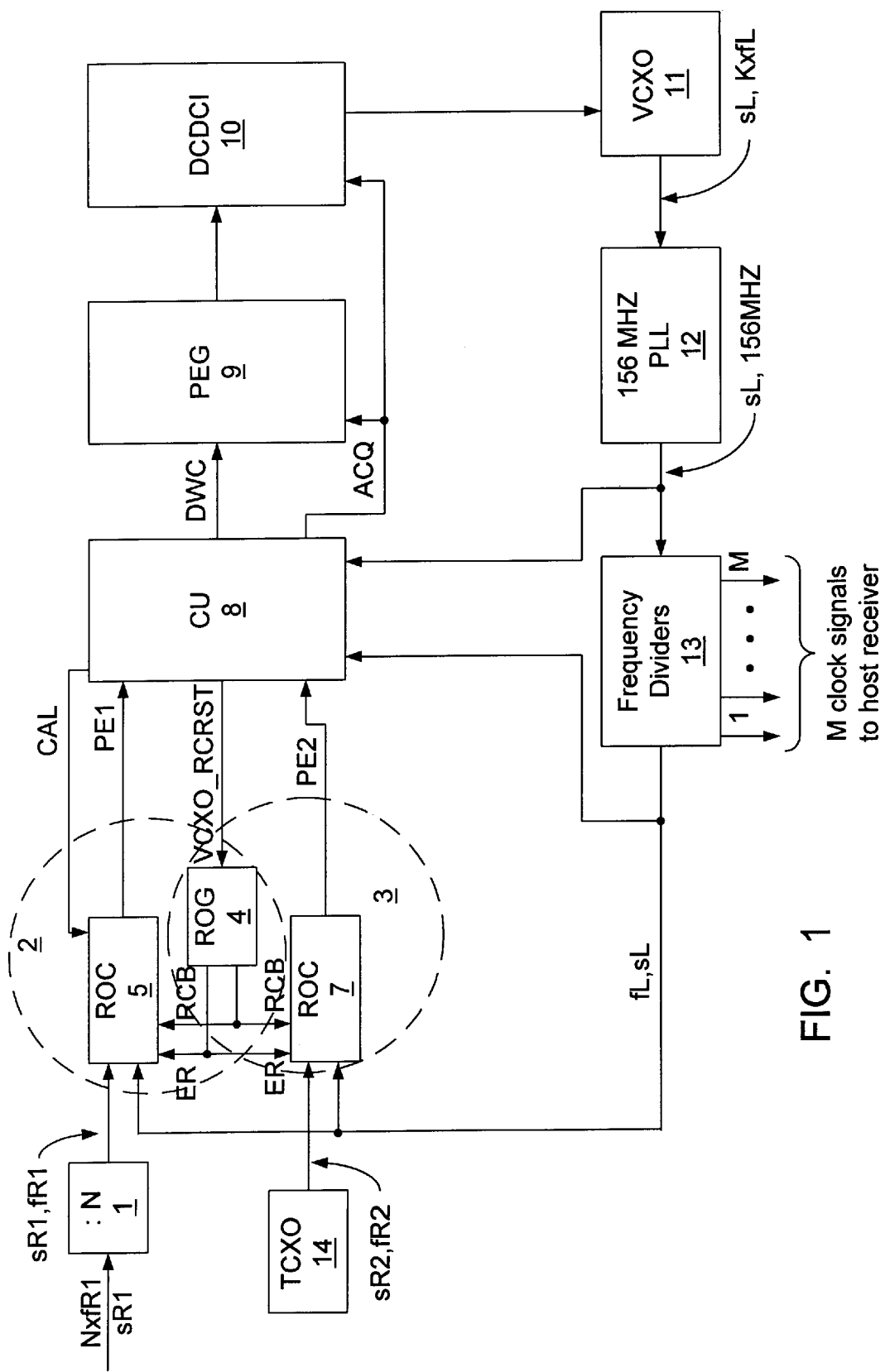
FIG. 1 is a block diagram of a microsynchronizer incorporating a DPD according to a preferred embodiment of the invention.

Referring firstly to FIG. 1, a microsynchronizer uses a first DPD designed in accordance with this invention and generally indicated by 2 to synchronize a host receiver with a transmitter by aligning a locally generated clock signal sL with reference clock information extracted from an incoming reference signal sR1. In particular, the microsynchronizer operates first in a digital acquisition mode followed by a digital locked mode for enabling a VCXO (voltage-controlled oscillator) 11 to locally generate the clock signal sL of frequency fL, through a 156 MHz PLL (phase locked loop) 12 and a frequency dividing unit 13 and in synchronism with the reference clock signal sR1 having a low reference frequency of fR1.

More specifically, the first DPD 2 has an ROG (ring oscillator generator) 4 coupled to a CU (control unit) 8 to receive a clock signal VCXO_RCRST. The ROG 4 produces two output signals ER (edge register) and RCB (ring counter buffer) (described in more detail below in reference to FIG. 3) to an ROC (ring oscillator capture) unit 5 which is also coupled to receive the signal sR1 of frequency fR1 through a frequency divider 1, the locally generated signal sL of frequency fL and a calibration clock signal CAL from the CU 8. This calibration signal CAL will be further described below in reference to FIGS. 5 and 7).

The microsynchronizer uses a second DPD generally indicated by 3 to receive a local reference clock signal sR2 having a frequency fR2 and generated by a TCXO (temperature-controlled oscillator) 14 for continuously monitoring and detect any phase shift in the frequency fL of the locally generated signal sL caused by inevitable temperature fluctuations of the circuit components. More specifically, the second DPD 3 has the same ROG 4 as that described above with reference to the first DPD 2 which is coupled to a ROC unit 7 via the same output signals ER and RCB (further described below). This ROC unit 7 is also connected to receive the TCXO output signal sR2 of frequency fR2 and the local signal sL of frequency fL for producing an output signal PE2 to the CU 8.

The CU 8 supplies its output signal DWC (density width code) and a control signal ACQ to a PEG (phase error generator) unit 9. The ACQ control signal is also supplied to a DCDCI (digitally controlled duty cycle integration) circuit 10 which is coupled to the output of the PEG unit 9. The DCDCI circuit 10 provides high resolution control voltages to the VCXO 11 for producing the local signal sL with a frequency of KxfL. The signal sL is then fed to the 156 MHz PLL 12 which is coupled to the CU 8 and the frequency dividing unit 13. The frequency dividing unit 13 produces the clock signal sL of frequency fL to the ROCs 5, 7 and CU 8 but is also coupled to provide the host receiver with a plurality M of clock signals synchronized to the low frequency reference clock signal sR1.

In operation, the microsynchronizer provides the host receiver with M clock signals derived from the VCXO 11 output signal sL and synchronized with the reference clock signal sR1. As noted before, to achieve synchronism with sR1, the microsynchronizer operates first in the digital acquisition mode followed by the digital locked mode. The selection of a particular mode of operation described above is regulated by the CU 8 with the ACQ control signal applied to both the PEG unit 9 and DCDCI circuit 10.

In the digital acquisition mode of operation, the microsynchronizer seeks to attain a loop frequency that is equal to the low reference frequency of interest fR1 of the signal sR1 received in the ROC 5. However, as the minimum time necessary to attain a DPLL lock state is dictated by the loop bandwidth, the microsynchronizer initially uses programmed phase error codes stored in the CU 8 to drive the PEG unit 9 via its DWC output signal so as to accelerate, to the maximum extent possible, the DPLL state acquisition process. The phase error codes received from the CU 8 are processed in the PEG unit 9 and converted into high gain analog control voltages by the DCDCI circuit 10 for use by the VCXO 11. The VCXO 11 generates the output signal sL of frequency KxfL to the 156 MHz PLL 12 where the frequency KxfL is multiplied to become 156 MHz. Such multiplication of the frequency fL is necessary to derive, in the frequency dividing unit 13, M clock signals with frequencies high enough to appropriately accommodate the needs of the host receiver.

However, for the purposes of attaining a stable digital frequency loop, the signal sL is reproduced by the frequency dividing unit 13 to operate at the frequency fL and fed back into the ROC 5 of the first DPD 2. For every respective sR1 edge and sL edge the ROC 5 captures the state of the ROG 4 for producing a corresponding reference clock phase signal and a local clock phase skew signal. These signals are supplied to the CU 8 via the phase error signal PE1 where they are processed to determine the actual phase error between sL and sR1. As the phase error is measured to be within the bandwidth of the operational frequency loop, the DCDCI circuit 10 no longer generates its control voltages based on programmed codes received from the CU 8 but rather on the phase error signal PE1 obtained from the ROC 5 and processed by the CU 8 and PEG unit 9.

In the digital locked mode of operation, the microsynchronizer provides a digital phase locked loop of the low frequency reference signal sR1. In this mode of operation, the ROC 5 of the DPD 2 receives the sR1 signal of frequency fR1 from the frequency divider 1 and the sL signal of frequency fL from the frequency dividing unit 13 and functions in a manner identical to that described above in relation to the digital acquisition mode of operation to capture the state of the ROG 4 for producing the PE1 signal which is then supplied to the CU 8 to calculate the phase error deviations of sL in reference to sR1.

The local clock signal sL is also supplied to the ROC 7 of the second DPD 3 with the fixed reference clock signal sR2 generated by the TCXO 14 to detect and compensate for undesirable phase drifts of the sL signal caused by inevitable variations in the electronic behavior of the microsynchronizer which are a direct result of temperature fluctuations of the host receiver. This fixed reference clock signal can be, for example, a Stratum-3 SONET clock. Similarly to the PE1 signal generated by the ROC 5 of the first DPD 2, the phase error signal PE2 generated by the second DPD 3 is also applied to CU 8 to be processed and transformed into a sequence of codes which are subsequently presented to the PEG unit 9 via the DWC signal. These codes are then applied to the DCDCI circuit 10 where they are converted into high resolution analog control voltages for use by the VCXO 11. The VCXO 11 output signal sL is fed to the frequency dividing unit 13 through the 156 MHz PLL 12 for producing M clock signals synchronized with sR1 and temperature-compensated in accordance with sR2. The DPLL loop is completed with the signal, sL, reproduced by the frequency dividing unit 12 to operate at the frequency fL and fed back into the ROCs 5, 7 of the first and second DPDs 2, 3 for respectively maintaining phase alignment with the clock signals sR1 and sR2.

The control voltage applied to the input of the VCXO 11 is calculated in relation to phase error signals PE1, PE2 and a number of provisioned parameters, such as the loop bandwidth and resolution. In particular, the control voltage generated by the DCDCI circuit 10 is applied until a target phase error is determined between the tracked signals, sR1, sR2 and the local clock signal sL by the microsynchronizer from the effective measured values of PE1, PE2. When the target phase error has been attained, the control voltage applied to VCXO 11 and the VCXO 11 output clock phase will oscillate around the target value to compensate for any undesired deviation of the loop lock, until a new target phase error is calculated.

For further information relating to the operation of the microsynchronizer, reference may be made to copending US patent eatitled "digitally controlled duty cycle integration (DCDCI)" filed on even date herewith in the name W. Bogdan. The disclosure of this application is incorporated herein by reference.

The first and second DPDs 2, 3 described above are identical in architecture and function for generating their respective output signal PE1, PE2 based on their respective input signals sR1, sL and sR2, sL. As such, only the DPD 2 will now be further described below in reference to FIGS. 2, 3, 4, 5, 6 and 7.

Figure 2:
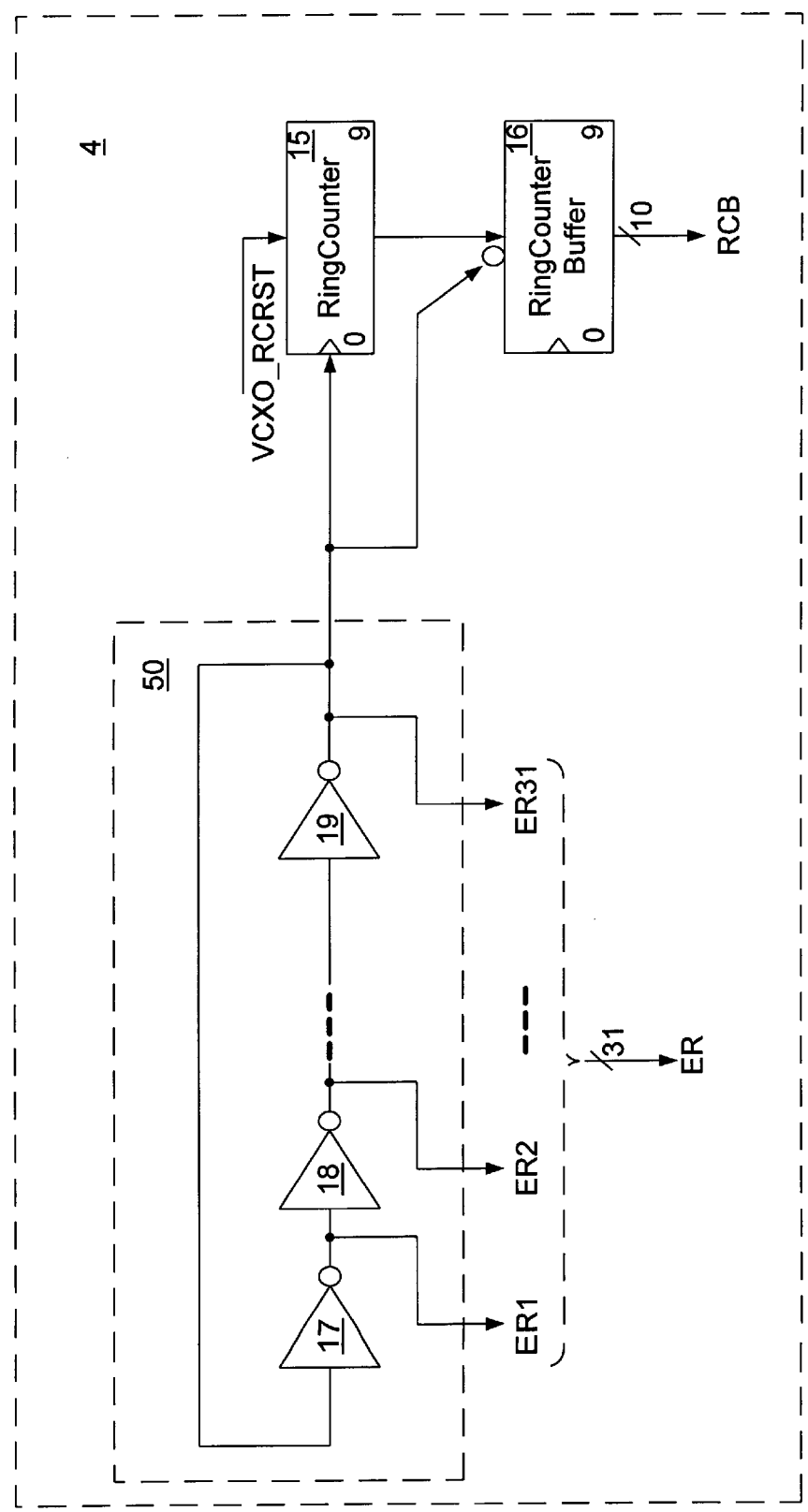
FIG. 2 is a block diagram of an ROG (ring oscillator generator) portion of the DPD illustrated in FIG. 1.

Referring firstly to FIG. 2, the ROG 4 functions to receive the reset signal VCXO_RCRST from the CU 8 for generating digital signals ER and RCB representative of the time elapsed in relation to the leading edge of VCXO_RCRST. More specifically, the ROG 4 has an odd plurality N of inverter gates 17, 18, 19 (only three shown) connected in series where the output of the last inverter gate 19 is coupled back to the input of the first inverter gate 17 to form an RO (ring oscillator) which is generally indicated by 50. The RO 50 designed in accordance with this invention preferably has 31 inverter gates 17, 18, 19 which produce respective outputs ER1, ER2 . . . ER31 (only three shown). These output signals ER1, ER2 . . . ER31 are grouped together as a 31-bit word to form the ER signal which is externally coupled to the ROCs 5, 7.

The ROG 4 further has a ring counter 15 externally connected to the CU 8 to receive the reset signal, VCXO_RCRST for producing an output signal to a ring counter buffer 16. The clock input of the ring counter 15 and the load input of the ring counter buffer 15 are connected to the output of the last inverter gate 19. The ring counter buffer 16 is externally coupled to the ROCs 5, 7 to produce the RCB signal.

In operation, the ROG 4 uses the RO 50 for high resolution digital monitoring of the time elapsed in relation to the leading edge of the reset signal VCXO_RCRST received from the CU 8. The odd plurality N of inverter gates 17, 18, 19 forming the RO 50 provides an unstable circuit where each inverter gate output ER1, ER2 . . . ER31, oscillates at a common frequency F having a period T which is directly related to the number of inverter gates 17, 18, 19 present in the RO 50 and their associated propagation delay. This digital oscillation is exemplified in FIG. 3 where time diagram representations of the outputs of a 5-inverter RO 51 are shown. The inverter gates 20, 21, 22, 23, 24 are assumed, in this example, to have a respective 0.2 nS propagation delay. The outputs of the inverter gates 20, 21, 22, 23, 24 respectively numbered 1, 2, 3, 4, and 5 are shown for t=0 nS to t=(10*0.2 nS) or 2 nS in 0,2 nS increments. It can be observed that at any point in time, the inverter gates 20, 21, 22, 23, 24 respective output is either "high" or "low". As time progresses, a transition edge, TE, which is either rising or falling, can also be observed as "travelling" around the ring configuration.

For every inverter gate output, the occurrence of two consecutive rising TEs defines the duration of the oscillation period T. The oscillation period T is further defined in terms of a first half period T1 and a second half T2 and is related, as noted above, to the number of inverter gates 20, 21, 22, 23, 24 present in the RO 51 and their associated propagation delay. T is expressed as follows:

$$T=2*N*PD$$

where N is the number of inverter gates and PD represents the average propagation delay. Applying this formula to this particular example where N=5 and PD=0.2 nS, the resulting period becomes T=(2*5*0,2 nS)=2 nS. Referring now back to FIG. 2, the RO 50 of the present invention preferably uses 31 inverter gates 17, 18, 19 each with an average 0.2 nS propagation delay. As a result, ER1, ER2 . . . ER31 each digitally oscillate in the manner described above in reference to FIG. 3 with an oscillation period of T=[2*31*0.2 nS]= 12.4 nS.

The digital oscillations are monitored by the ring counter 15 which functions to count the number of oscillation periods of the last inverter gate output ER31 occurring after the reception of the leading edge of the VCXO_RCRST signal. Preferably, the ring counter 15 is selected to count a large number of oscillation periods. For example, the present invention uses a 10-bit ring counter 15. The selection of a large ring counter 15 enables the ROG 4 to digitally monitor a relatively long period of time elapsed in relation to the leading edge of the reset signal VCXO_RCRST received and make this timing information available for capture by the ROC unit 5 with digital signals ER and RCB.

Figure 4:
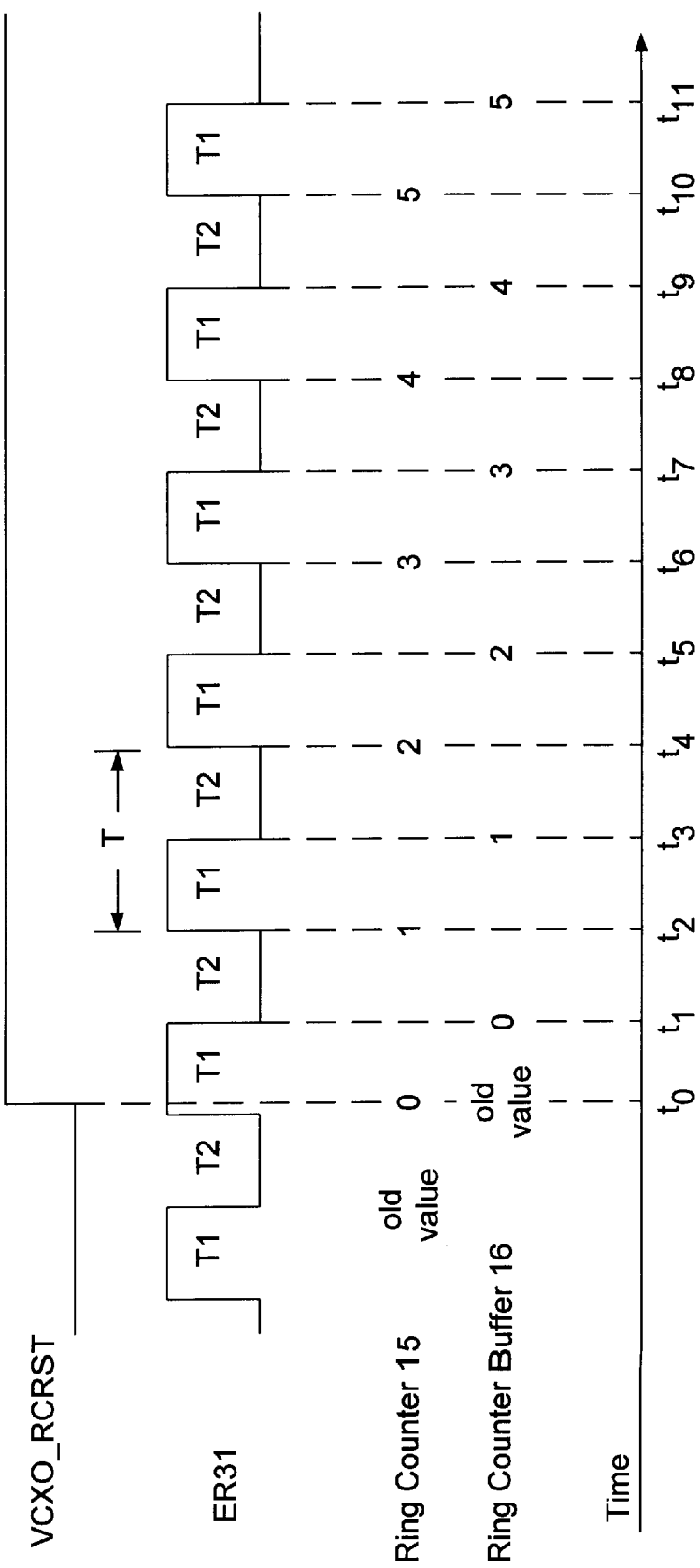
FIG. 4 shows additional time plots for the ROG illustrated in FIG. 2.

FIG. 4 illustrates a timing diagram for the ROG 4 in relation to the VCXO_RCRST edge. More particularly, the inverter gate output ER31 and the respective content of the ring counter 15 and ring counter buffer 16 are shown for 5 complete oscillation periods T of the RO 50 calculated above to be 12.4 nS or, in other words, for $t=t_0$ to $t=t_{11}$ in 12.4 nS increments. It can be observed that the ring counter 15 is reset by the VCXO_RCRST edge at $t=t_0$. As the ring counter 15 starts counting from $t=t_0$, the time elapsed from the occurrence of the VCXO_RCRST edge is monitored starting from the same time, namely $t=t_0$.

It can also be observed that the content of the ring counter 15 does not accurately represent the time elapsed. For example, at $t=t_2$, one oscillation period T has been recorded in the ring counter 15 but the time elapsed since the occurrence of the VCXO_RCRST edge does not correspond to a complete oscillation period T. However, this arbitrary offset is eliminated as each set of ROG captures effected in the ROC 5 at the occurrence of sL and sR1 edges or effected in the ROC 7 at the occurrence of sL and TCXO edges are made with respect to the same VCXO_RCRST edge and are substracted from one another in the CU 8 to obtain the corresponding phase error measurements.

In can also be observed that at the end of each oscillation period, the number of oscillation periods carried by the ring counter 15 is incremented by one on the occurrence of a corresponding ER31 rising edge. This value is not directly made available for capture by the ring counter 15 because of potential interferences from the ER31 rising edges which could alter the content of the ring counter 15 during RCB captures. Instead, the content of the ring counter 15 is transferred to the ring counter buffer 16 on the falling edge of ER31 before it can be captured via the RCB signal. Consequently, the value carried by the ring counter buffer 16 is only updated half a period T1 after the end of each oscillation period T before it becomes representative of the time elapsed with respect to an VCXO_RCRST edge.

Figure 5:
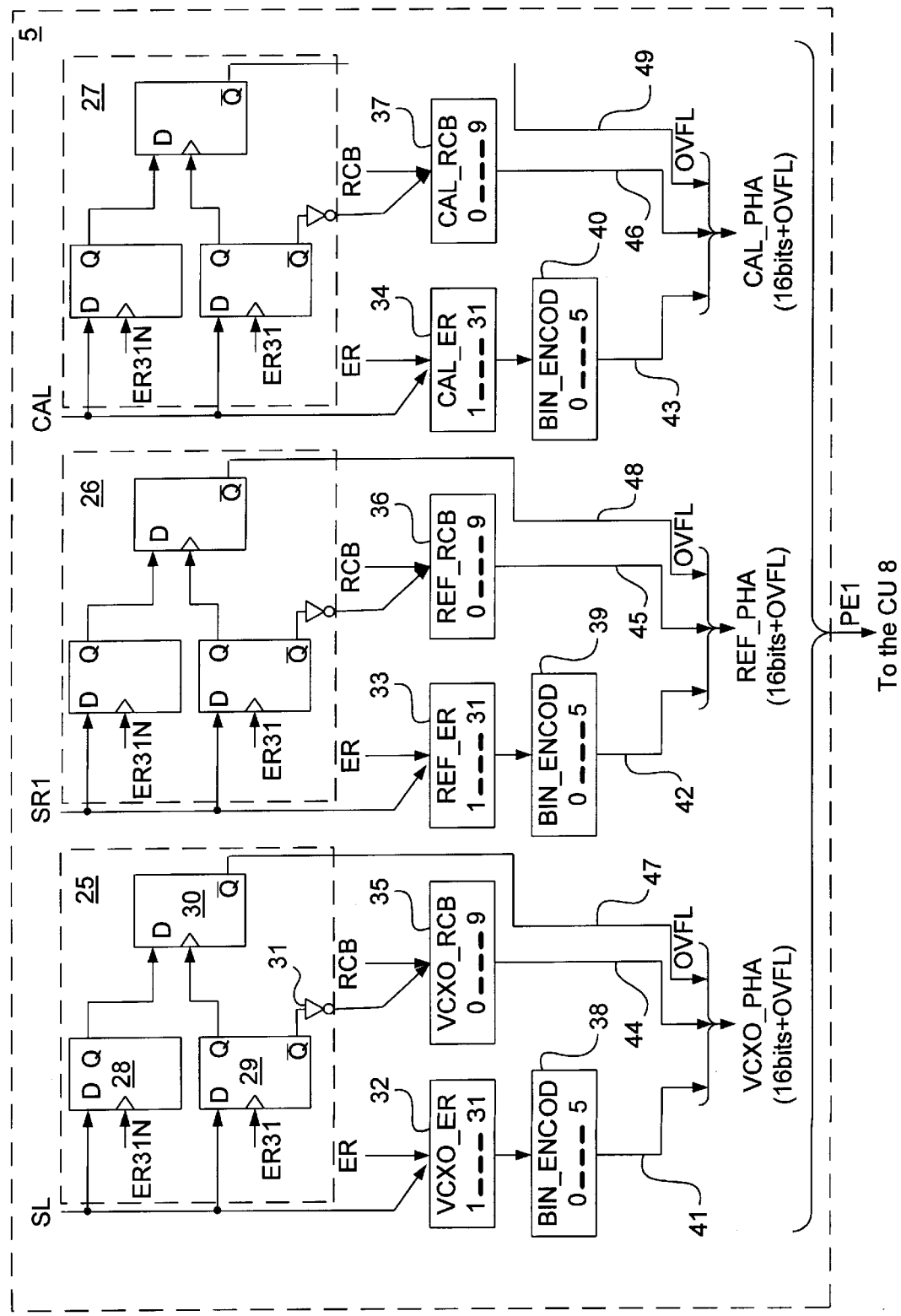
FIG. 5 is a block diagram of an ROC (ring oscillator capture) unit of the DPD illustrated in FIG. 1.
Figure 6:
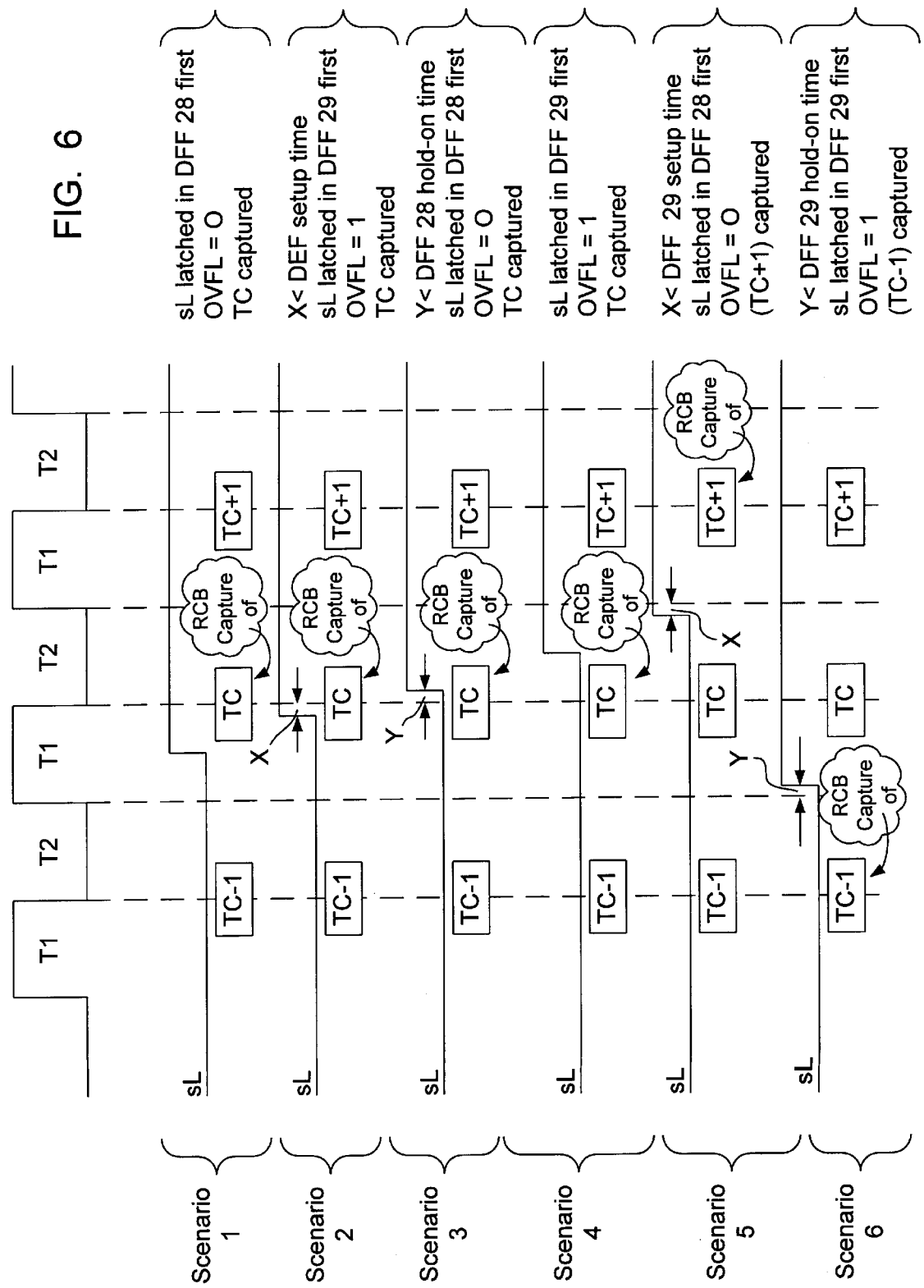
FIG. 6 shows time plots for a TOC (timing overflow circuit) portion of the ROC unit illustrated in FIG. 5.

Referring now to FIG. 5, the ROC unit 5 functions to receive the sL, sR1 and CAL clock signals described above with reference to FIG. 1 and measure their respective phase skew in relation to the fixed reference VCXO_RCRST clock signal received from the CU 8 for producing a corresponding local clock phase skew signal VCXO_PHA, a reference clock signal REF_PHA and a calibration clock phase skew signal CAL_PHA which are combined to form the PE1 signal and subsequently supplied to the CU 8 for processing. More specifically, the ROC unit 5 has three ER buffers 32, 33, 34 respectively coupled to receive the ER signal from the ROG 4. The load inputs of these ER buffers 32, 33, 34 are respectively coupled to receive the sL, sR1, and CAL clock signals. Further, the ER buffers 32, 33, 34 supply their respective output to binary encoders 38, 39, 40 for producing a first segment 41, 42, 43 of the corresponding output signal VCXO_PHA, REF_PHA and CAL_PHA. VCXO_PHA, REF_PHA and CAL_PHA are grouped together to form the output signal PE1 described above in reference to FIG. 1 which is coupled to the CU 8. The ROC unit 5 further has a plurality of RCB buffers 35, 36, 37 connected to the ROG 4 for receiving the RCB signal. These RCB buffers 35, 36, 37 respectively produce a second segment 44, 45, 46 of the output signals VCXO_PHA, REF_PHA and CAL_PHA described above and derive their respective load input signal from a corresponding TOC (timing overflow circuit) generally indicated by 25, 26 and 27. The TOCs 25, 26, 27 are interconnected in an identical manner to respectively receive and process the sL, sR1 and CAL signals for respectively producing an OVFL (overflow) signal 47, 48, 49 and the load input signal for the corresponding RCB buffer 35, 36, 37. As such, only the architecture of the TOC 25 will now be described.

The TOC 25 has the D input of first and second DFFs (D flip-flop) 28, 29 connected to receive the sL signal. The DFFs 28, 29 clock inputs are respectively coupled to the ROC 4 to receive the ER31 signal. The inverted Q output produced by the second DFF 29 is externally coupled to the load input of the RCB buffer 35 through an inverter gate 31 internal to the TOC 25. The TOC 25 further has a third DFF 30 which has its D and clock inputs respectively coupled to receive the Q outputs of the first and second DFF 28, 29 for producing the OVFL signal 47 via the inverted Q output which forms a third segment of the output signal VCXO_PHA.

In operation, the ROC unit 5 operates to receive the sL, sR1 and CAL clock signals described above with reference to FIG. 1 and measure their respective phase skew in relation to the fixed reference VCXO_RCRST clock signal received from the CU 8. For each of the sL, sR1 and CAL signals, the ROC unit 5 captures the ER and RCB signals to evaluate the time elapsed between the occurrence of a VCXO_RCRST edge and the respective sL, sR1 and CAL edges detected thereafter for producing the corresponding VCXO_PHA, REF_PHA and CAL_PHA.

More specifically, each sL, sR1 and CAL edge detected operates to directly trigger the capture of the ER signal in respective ER buffers 32, 33, 34. The ER signal status thus captured is immediately fed into respective binary encoders 38, 39, 40 where the 31-bit ER signal is encoded into a 6-bit word for producing the first segment 41, 42, 43 of the corresponding VCXO_PHA, REF_PHA and CAL_PHA output signals. The sL, sR1 and CAL edges detected also function to trigger, indirectly through the TOCs 25, 26, 27, the capture of the RCB signal in respective RCB buffers 35, 36, 37. The RCB signal thus captured is 10-bit wide and forms the second segment 44, 45, 46 of the corresponding VCXO_PHA, REF_PHA and CAL_PHA output signals.

The TOCs 25, 26, 27 are necessary for delaying the capture the RCB signal long enough to account for the T1 delay inserted after the ring counter 15 (see FIGS. 2 and 4 above) so as to obtain RCB reads which are representative of the number of oscillation periods elapsed in relation to the VCXO_RCRST signal. The RCB capture effected in respective RCB buffers 35, 36, 37 is therefore dependent on the timing of the corresponding TOC 25, 26, 27. The TOCs 25, 26, 27 have an identical mode of operation and as such, the RCB capture will now be further described only in reference to the TOC 25.

Upon detecting an sL edge, the TOC 25 and more specifically the DFF 29 functions to delay the RCB capture in the corresponding RCB buffer 35 until the occurrence of the next ER31 rising edge for obtaining the most accurate RCB read of the RO 50 status. The RCB capture timing is further described in FIG. 6 for 6 different timing scenarios of the signal sL in relation to the oscillation periods of the RO 50 recorded in the ring counter 15 via the signal ER31. In particular, the content of the ring counter buffer 16 available for RCB capture is expressed in relation to the desired RCB capture which is indicated by TC (target capture). TC is representative of the actual number of oscillation periods elapsed from the occurrence of a VCXO_RCRST edge until the occurrence of the sL edge.

It can be observed that in most situations (see scenarios 1, 2, 3 and 4), the RCB capture is triggered on the first ER31 rising edge occurring after the sL edge when the number of oscillation periods carried by the ring counter buffer 16 is equal to TC and therefore representative of the time elapsed from the occurrence of a VCXO_RCRST edge until the occurrence of the sL edge. However, in other instances (see scenarios 5 and 6), the occurrence of the sL edge is such that the RCB capture is triggered at a time where the ring counter buffer 16 does not carry a value representative of the actual number of RO oscillation periods which have occurred since the occurrence of a VCXO_RCRST edge. More specifically, in scenario 5, sL is received at an arbitrary distance X before the end of an oscillation period and therefore slightly before the occurrence of the ER31 rising edge such that the setup time requirement of the DFF 29 is not met. Consequently, the RCB is not captured on the ER31 rising edge immediately following the sL edge but rather on the subsequent ER31 rising edge which results in the capture of (TC+1). In scenario 6, sL is received at an arbitrary distance Y after the start of a new oscillation period and therefore slightly after the occurrence of the ER31 rising edge such that the hold-on time requirement of the DFF 29 is not met. This causes the RCB to be captured on the ER31 rising edge preceding the sL edge which results in the capture of (TC−1).

In order to adjust the RCB capture to the right number of oscillation periods TC, the TOC 25 also functions to produce the overflow signal OVFL which is subsequently supplied to the CU 8 via the PE1 signal where it is used in combination with the ER capture to determine whether the RCB capture has to be adjusted to TC. Refering now back to FIG. 5, this OVFL forms the third segment 47 of the corresponding output signal VCXO_PHA and is generated by the combined operation of the DFFs 28, 29 and 30. In particular, DFFs 28 and 29 respectively latch the sL signal on the falling edge of ER31 (ER31N) and on the rising edge of ER31. Their respective Q outputs are fed into the DFF 30 where the Q output of the DFF 28 is clocked in by the Q output of the DFF 29. If the DFF 28 latches sL before it is latched in the DFF 29, the Q output of the DFF 29 clocks a "high" into the D input of DFF 30 for producing the OVFL "low" signal via the inverted Q output. If the DFF 28 latches sL after it is latched in the DFF 29, the Q output of the DFF 29 clocks a "low" into the D input of the DFF 30 for producing the OVFL "high" signal also via the inverted Q output.

Refering back to FIG. 5, this OVFL state dependance on which of the DFF 28 or DFF 29 latches the sL edge first is described for each of the six sL timing scenarios. In particular, it can be observed that the state of the OVFL signal is immaterial in situations such as scenarios 1, 2, 3, 4 since the number of oscillation periods captured via the RCB signal is equal to TC and therefore the RCB capture does not need to be adjusted. However, for a situation such as scenario 5, the OVFL signal is also used by the CU 8 to adjust the RCB capture from (TC+1) to TC before any processing of the VCXO_PHA signal takes place. Similarly, for a situation such as scenario 6, the OVFL signal is used in the CU 8 to adjust the RCB capture from (TC−1) to TC before any further processing of the VCXO_PHA.

Figure 7:
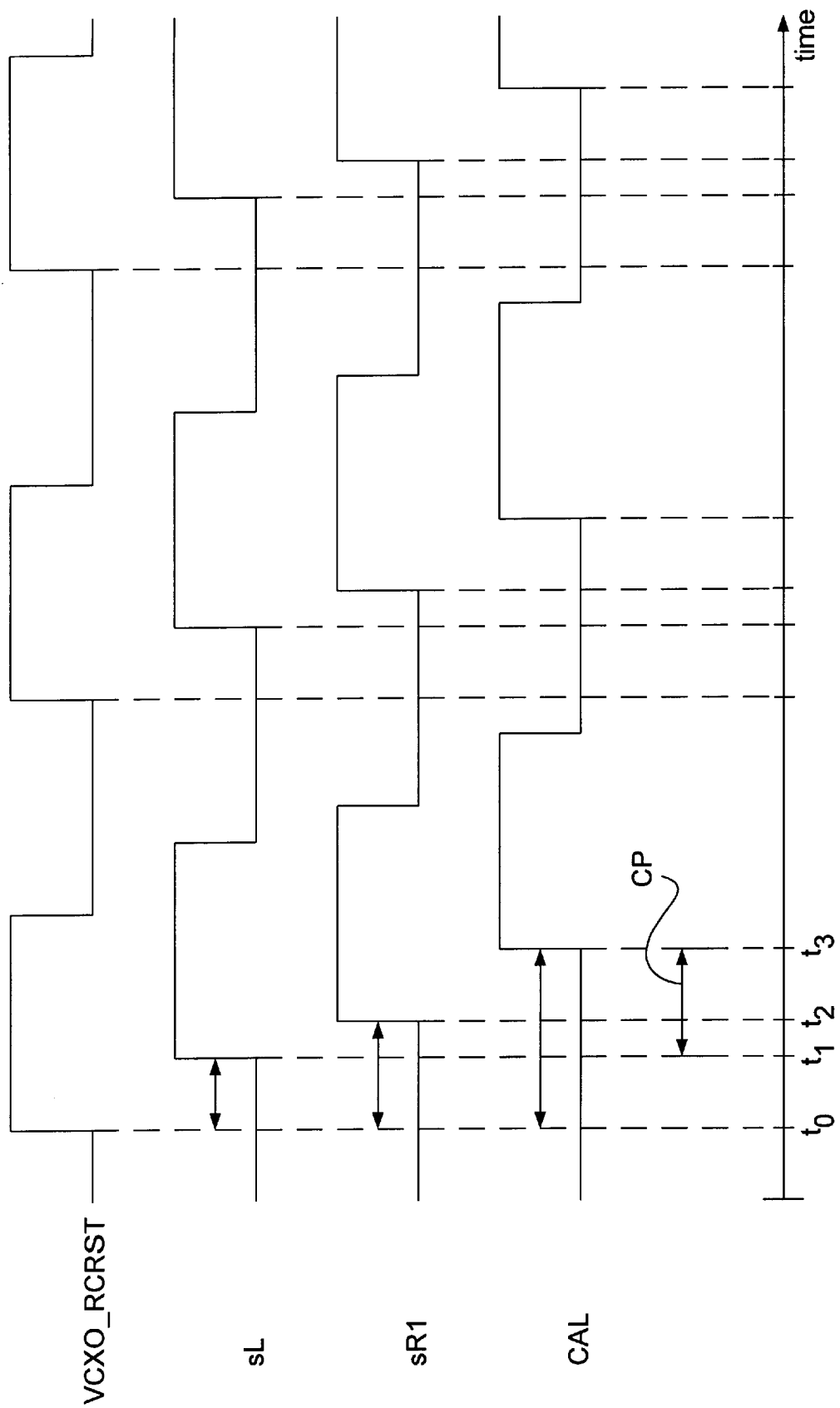
FIG. 7 shows time plots for the ROC unit illustrated in FIG. 5.

FIG. 7 shows timing diagrams of respective VCXO_RCRST, sL, sR1 and CAL signals for the ROC unit 5. It can be observed that the VCXO_RCRST signal received from the CU 8 is generated such that sL, sR1 and CAL edges are detected shortly after the occurrence of a VCXO_RCRST edge. This is to ensure that the time intervals to be monitored by the ROG 4 are within the range of the ring counter 15. The timing diagrams illustrate the case where a VCXO_RCRST edge is generated at $t=t_0$ and sL, sR1 and CAL edges are respectively detected by the ROC unit 5 shortly thereafter at $t=t_1$, $t=t_2$, $t=t_3$. In this scenario, the ROC unit 5 functions to capture the status of the RO 50 with the ER and RCB signals for each one of the sL, sR1 and CAL edges detected and correspondingly produce the VCXO_PHA, REF_PHA and CAL_PHA output signals. These output signals respectively hold the number of digital oscillations which have occurred in the RO 50 between the last VCXO_RCRST edge received in the ring counter 15 and the subsequent sL, sR1, CAL edge detected thereafter. The VCXO_PHA, REF_PHA and CAL_PHA output signals are therefore respectively representative of the phase skew between the VCXO_RCRST edge and the corresponding one of sL, sR1 and CAL edges.

The VCXO_PHA, REF_PHA and CAL_PHA output signals grouped together to form the PE1 output signal to convey the phase skew measurements of respective sL, sR1, CAL edges in relation to the VCXO_RCRST edge are supplied to the CU 8 for determining the phase error between sL and sR1. In this particular embodiment, the CU 8 initially adjusts the RCB segment of each of the VCXO_PHA, REF_PHA and CAL_PHA signals when certain ER and OVFL conditions are present. More specifically, when a sL, sR1 or CAL edge is detected to occur slightly before the occurrence of an ER31 rising edge, the corresponding ER signal captured and supplied to the CU 8 is large. When this coincides with the OVFL being "low" (scenario 5 in FIG. 6), the CU 8 adjusts the RCB segment from (TC+1) to TC. When the ER captured is small (this happens when the sL, sR1 or CAL edge is detected slightly after the occurrence of an ER31 rising edge) and the OVFL is "high" (scenario 6 in FIG. 6), the CU 8 adjusts the RCB segment from (TC−1) to TC. If these conditions are not present, the RCB segment remains unaltered. The CU 8 then digitally calibrates the VCXO_PHA and REF_PHA signals in a manner described below and subtracts the calibrated VCXO_PHA from the calibrated REF_PHA to determine the number of digital oscillations of the RO 50 recorded between the occurrence of the corresponding sL and sR1 edges. The associated phase error is obtained by simply multiplying this result with the average inverter propagation delay of the inverter gates 17, 18, 19 used in the RO 50.

The accuracy of the phase error thus determined is dependent upon the accuracy of the average inverter propagation delay value used in the calculations. In other words, for each ROC capture, this average inverter propagation delay value must accurately represent the actual average inverter propagation delay experienced in the RO 50. This is because the propagation delay of each of the inverter gates 17, 18, 19 may be affected by various process variations such as, for example, power supply ripple and temperature fluctuations. In order to obtain accurate ROG 4 captures, the CU 8 generates the CAL clock signal and supplies it to the ROC 5 where phase skew measurements are made in relation to the VCXO_RCRST in the manner described above in reference to FIG. 5 for producing the CAL_PHA signal.

More specifically, the CAL signal supplied to the ROG 4 is a highly stable clock signal derived from sL and generated by the CU 8 with the frequency fL but delayed in time by a fixed amount. The phase difference between CAL and sL is referred in FIG. 7 as the CP (calibration period). The CP between sL and CAL allows the CU 8 to accurately determine the appropriate average propagation delay for each set of VCXO_PHA and REF_PHA phase skew measurements received from the ROC 5 and therefore calibrate the associated phase error between sL and CAL calculated therein so that it is accurately representative of the actual phase misalignment between sL and sR1. The preferred embodiment of this invention uses, for example, a time delay which corresponds to 256 cycles of the highly stable 156 MHz PLL 12 output clock having a frequency of 156 MHz and a corresponding period of 1/156 MHz. Accordingly, the resulting CP is therefore calculated to be (256*1/156 MHz). Therefore, for each set of VCXO_PHA and REF_PHA phase skew measurements received from the ROC 5, the average propagation delay is calculated by digitally dividing in the CU 8 the CAL_PHA signal by CP. As noted above, the associated calibrated phase error between sL and sR1 is obtained by digitally subtracting the VCXO_REF signal from the REF_PHA signal and multiplying the result with the average inverter propagation delay of the inverters 17, 18, 19 calculated in the manner described above.

I claim:

1. A digital phase detector for providing an indication of a phase skew relationship between a first and a second signal, the digital phase detector comprising:

an oscillating circuit having an input for receiving a reset signal and outputs on which are provided signals representing the state of the oscillating circuit; and a capture circuit having inputs for receiving the first and second signals, respectively, and having inputs connected to the outputs of the oscillating circuit, the capture circuit capturing the state of the oscillating circuit at the occurrence of an edge of the first and second signals for determining the phase skew relationship.

2. The digital phase detector of claim 1 in combination with a CU (control unit) wherein the captured states are supplied to the CU for determining the phase skew relationship between the first and second signals.

3. A digital phase detector for providing an indication of a phase skew relationship between a first and a second signal, the digital phase detector comprising:
an oscillating circuit; and
a capture circuit having inputs for receiving the first and second signals, respectively, the capture circuit capturing the state of the oscillating circuit at the occurrence of an edge of the first and second signals for determining the phase skew relationship wherein the oscillating circuit is an ROG (ring oscillator generator) and comprises:
an RO (ring oscillator) having a predetermined oscillation period and producing a first digital output signal representative of the state of the RO and available for capture;
a ring counter having an input port for receiving a reset signal, a clock port coupled to the RO for monitoring the oscillation periods and an output port for producing an integer count of the oscillation periods in relation to the reset signal; and
a ring counter buffer coupled to the ring counter for producing a second digital output signal representative of the state of the ring counter and available for capture.

4. The digital phase detector of claim 3 wherein the RO comprises a plurality of inverter gates connected in a ring configuration for producing a corresponding plurality of output signals which form the first digital output signal.

5. The digital phase detector of claim 3 wherein the capture circuit is an ROC (ring oscillator circuit) which, for each of the first and second signals comprises:
a first buffer coupled to receive the first digital output signal for capturing the state of the RO at the occurrence of an edge of the associated first or second signal to provide a first segment of the captured state of the ROG;
a timing circuit coupled to receive the associated first or second signal for producing a capture trigger signal;
a second buffer coupled to receive the second digital output signal for capturing the state of the ring counter at the occurrence of an edge of the capture trigger signal to provide a second segment of the captured state of the ROG; and
the timing circuit for producing an overflow signal to provide a third segment of the captured state of the ROG.

6. The digital phase detector of claim 5 wherein for each of the first and second signals, the digital phase detector further comprises a binary encoder coupled to the first buffer for encoding the captured state of the RO to provide the first segment of the captured state of the ROG.

7. The digital phase detector of claim 5 wherein each timing circuit comprises a first flip-flop gate having an input coupled to receive the associated first or second signal and an inverted output connected in series with an inverter gate for producing the capture trigger signal.

8. The digital phase detector of claim 7 wherein each timing circuit further comprises a second flip-flop gate having an input coupled to receive the associated first or second signal and a non-inverted output for connection with a third flip-flop gate, the third flip-flop gate having a clock input for receiving the non-inverted output of the first flip-flop gate and an inverted output for producing the overflow signal.

9. The digital phase detector of claim 1 wherein the capture circuit is connected to capture the state of the oscillating circuit at the occurrence of an edge of a calibration signal.

10. The digital phase detector of claim 9 in combination with a CU (control unit) wherein the captured states at the occurrence of an edge of the first and second inputs and at the occurrence of an edge of the calibration signal are supplied to the CU for providing a calibrated phase skew relationship between the first and second signals.

11. The digital phase detector of claim 3 wherein the capture circuit is connected to capture the state of the oscillating circuit at the occurrence of an edge of a calibration signal.

12. The digital phase detector of claim 11 wherein the capture circuit is an ROC (ring oscillator capture) which, for each of the first, second and calibration signals comprises:
a first buffer coupled to receive the first digital output signal for capturing the state of the RO at the occurrence of an edge of the associated first, second or calibration signal to provide a first segment of the captured state of the ROG;
a timing circuit coupled to receive the associated first, second or calibration signal for producing a capture trigger signal;
a second buffer coupled to receive the second digital output signal for capturing the state of the ring counter at the occurrence of an edge of the capture trigger signal to provide a second segment of the captured state of the ROG; and
the timing circuit for producing an overflow signal to provide a third segment of the captured state of the ROG.

13. The digital phase detector of claim 12 wherein for each of the first, second and calibration signals further comprises a binary encoder coupled to the first buffer for encoding the captured state of the RO to provide the first segment of the captured state of the ROG.

14. The digital phase detector of claim 12 wherein each timing circuit comprises a first flip-flop gate having an input coupled to receive the associated first, second or calibration signal and an inverted output connected in series with an inverter gate for producing the capture trigger signal.

15. The digital phase detector of claim 14 wherein each timing circuit further comprises a second flip-flop gate having an input coupled to receive the associated first, second or calibration signal and a non-inverted output for connection with a third flip-flop gate, the third flip-flop gate having a clock input for receiving the non-inverted output of the first flip-flop gate and an inverted output for producing the overflow signal.

16. A method of determining a phase skew relationship between a first and a second signal, the method comprising the steps of:
generating a reset clock signal having a predetermined repetition rate;
resetting the oscillating circuit in response to an edge of the reset clock signal;
capturing the state of an oscillating circuit at the occurrence of and edge of the first signal;
capturing the state of the oscillating circuit at the occurrence of an edge of the second signal; and
processing the captures for determining the phase skew relationship between the first and second signals.

17. The method of claim 16 wherein the step of capturing the state of the oscillating circuit at the occurrence of an edge of the respective first and second signal provides a corresponding first and second count of the oscillation periods elapsed from the reset of the oscillating circuit.

18. The method of claim 17 wherein the step of processing consists of calculating the difference between the first and second count and of multiplying the difference by the oscillation period for determining the phase skew relationship between the first and second signals.

19. The method of claim 18 further comprising the steps of:

generating a calibration signal;

capturing the state of the oscillating circuit at the predetermined occurrence of an edge of the calibration signal; and processing the calibration capture to calibrate the oscillation period for providing a calibrated phase skew relationship between the first and second signals.

* * * * *